US009255971B2

United States Patent
Hu et al.

(10) Patent No.: US 9,255,971 B2
(45) Date of Patent: Feb. 9, 2016

(54) DEVICE AND METHOD FOR DETECTING STATE OF HEALTH OF BATTERIES

(71) Applicant: AUTOMOTIVE RESEARCH & TESTING CENTER, Lugang Chen, Changhua Hsien (TW)

(72) Inventors: Tsung-Hsien Hu, Changhua Hsien (TW); Yi-Chau Chiou, Changhua Hsien (TW)

(73) Assignee: AUTOMOTIVE RESEARCH & TESTING CENTER, Lugang Chen, Changhua Hsien (TW)

( * ) Notice: Subject to any disclaimer, the term of this patent is extended or adjusted under 35 U.S.C. 154(b) by 525 days.

(21) Appl. No.: 13/722,406

(22) Filed: Dec. 20, 2012

(65) Prior Publication Data

US 2014/0088896 A1 Mar. 27, 2014

(30) Foreign Application Priority Data

Sep. 21, 2012 (TW) .............................. 101134681 A (51) Int. Cl.
*G01R 31/36* (2006.01)
*G06F 15/00* (2006.01)

(52) U.S. Cl.
CPC .......... *G01R 31/362* (2013.01); *G01R 31/3651* (2013.01); *G01R 31/3679* (2013.01); *G06F 15/00* (2013.01)

(58) Field of Classification Search
CPC .. G01R 31/36; G01R 31/362; G01R 31/3606; G01R 31/3624; G01R 31/3651; G01R 31/3679; G06F 15/00
See application file for complete search history.

(56) References Cited

U.S. PATENT DOCUMENTS

| 2004/0024546 A1* | 2/2004 | Richter ........................... 702/63 |
| 2007/0252600 A1 | 11/2007 | Chou et al. |
| 2009/0128097 A1 | 5/2009 | Esnard |

* cited by examiner

*Primary Examiner* — Toan Le
(74) *Attorney, Agent, or Firm* — patenttm.us (57) ABSTRACT

A device for detecting state-of-health (SOH) of batteries has a detection module, a computation control module and an output module. The computation control module is electrically connected to the detection module and the output module. The detection module detects voltage values of a battery at multiple test points. The computation control module converts the voltage values at the test points into a ratio and maps the ratio to a SOH value in a SOH curve of the battery indicative of a state of health of the battery and the SOH value is outputted through the output module. The present invention can easily detect the SOH of a battery within a short period of time to solve the existing problems of being time-consuming and complicated in determining the SOH of batteries and causing incorrect determination of battery capacity and additional maintenance cost.

6 Claims, 10 Drawing Sheets

DEVICE AND METHOD FOR DETECTING STATE OF HEALTH OF BATTERIES

BACKGROUND OF THE INVENTION

1. Field of the Invention

The present invention relates to a device for detecting state of health (SOH) of batteries and more particularly to a device capable of quickly mapping to a detected voltage of a battery to an instant SOH of the battery from a known curve for the SOH of the battery.

2. Description of the Related Art

Progress in battery technology and demands for energy conservation, carbon reduction and environmental protection render more and more opportunities to the use of electric vehicles. To meet the requirement of higher driving range and performance, the battery pack used in the electric vehicles is formed by multiple batteries connected in series or series-parallel to achieve desired voltage and capacity, and increasing efficiency and performing degradation analysis are the critical measures to meet the foregoing requirement.

The major energy source of electric vehicles comes from the battery packs mounted inside the electric vehicles. The capacity of energy stored inside the battery pack is an important criterion for users to consider charging the battery pack. Despite the currently growing market demand for electric vehicles, most of the existing electric vehicles are dedicated to short to medium range commuting. Users of most electric vehicles live in residential buildings or apartments. Unless any charging outlet or charging station is available in the parking area, charging an electric vehicle could become an issue. Hence, a preferable solution is to widely build battery exchange stations. When electric vehicles are running out of battery, drivers of the electric vehicles can pay for a fully charged battery pack from a neighboring battery exchange station to replace the original battery pack and the amount of the payment for the exchange depends on the remaining capacity of the replaced battery pack. The battery exchange station then needs to test the battery capacity and perform a battery degradation test of the replaced battery pack.

When a effective capacity of a battery applied in an electric vehicle is lower than 80% from the original capacity, the battery is deemed as one with serious degradation and no longer complies with the requirement of the electric vehicle. Hence, performing a battery degradation test can avoid miscalculation of an existing effective capacity of the replaced battery.

Devices in the market for capacity estimation and degradation test of batteries focus on the lead-acid batteries for vehicles, and the most common devices are battery life testers or battery testers. The battery life tester has a high-power load circuit mounted therein for a large discharging current so that the battery life tester can measure a voltage drop and thus a discharging capability of batteries. A state of degradation of the battery can be determined from the discharging capability. Because of the high-power load circuit, the battery life tester is bulky and inconvenient to be carried around. The discharge current during the test period is rather high so that the testing time of the battery should be short to avoid the effect of degradation or damage on the battery. The battery testers serve to analyze four items (voltage, cold start current, resistance and battery energy) to determine the degradation degree of a battery. Practically, the resistance (internal resistance) of a battery is measured through an AC measurement method for measuring the internal resistance of a battery to obtain a corresponding battery capacity. However, when a battery tester is measuring the internal resistance of a battery, the engine of the vehicle must be turned off for at least one hour, and only one battery is allowed for testing at a time. When multiple batteries are connected in series, it is impossible to measure the battery capacity of each battery.

Disclosed as a currently available technique for detecting state of health (SOH) of batteries, the U.S. patent publication number 20070252600 entitled "Diagnosis method for state-of-health of batteries", discharges a constant current from a battery for a long period of time, then measures a voltage value of the battery, observes a voltage variation rate, and further determines if the SOH of the battery is abnormal. However, such technique takes a long time for the battery to discharge, the degradation of the battery is the only state that can be determined, and an instant SOH of the battery cannot be rapidly diagnosed.

Furthermore, as disclosed in the U.S. patent publication number 20090128097 entitled "Method and system for tracking battery state of health", the system for tracking battery SOH is composed of a charger, a charging counter and a processor. When the system charges a battery to be tested and starts counting time, the capacity of the battery during the charging course is calculated and is compared with a original capacity of the battery to determine the SOH of the battery. As the calculation of the capacity involves an accumulative method, long estimation time fails to achieve fast determination and a specially designed filter is required, an instant SOH of the battery is unable to be diagnosed.

From the foregoing, most conventional devices measure battery capacity using a current method and an internal resistance method. The current method employs a specific current-discharging pattern and measures a voltage variation rate serving as a basis for determining the SOH of the battery. The drawback of the current method resides in that a long discharge time arises from complete life cycle test of the battery. The determination of SOH is limited to merely determining if the battery is healthy without knowing the health degree of the battery. The internal resistance method needs to provide an external input voltage of a battery to be tested for measuring an internal resistance value of the battery, and determines a degradation status of the battery after a calculation. The drawback of the internal resistance method resides in that the measuring device demands for higher specification, is thus more costly and is composed of many subsystems. The accumulative method continuously measures and records an electric charge of a battery during the course of discharge and compares the measured electric charge with an originally recorded electric charge of the battery to determine the SOH of the battery. The drawback of the accumulative method resides in that fast determination of SOH is impossible because a complete charge or discharge procedure is required and a specially designed filter must be provided.

SUMMARY OF THE INVENTION

An objective of the present invention is to provide a device and a method for detecting state of health of batteries. It is capable of easily detecting the SOH of a battery within a short period of time and solving the existing problems of being time-consuming and complicated in determining the SOH of batteries and causing incorrect determination of battery capacity and additional maintenance cost.

To achieve the foregoing objective, the method for detecting SOH of batteries, comprising steps of:

providing a SOH curve for a battery;

performing a voltage detection procedure for detecting and recording voltage values of the battery at multiple test points set up in the voltage detection procedure; and calculating a ratio of a voltage difference between the voltage values at two of the test points over an original voltage difference and using the ratio to map to a SOH value in the SOH curve.

To achieve the foregoing objective, the device for detecting SOH of batteries has a detection module, a computation control module and an output module.

The detection module is connected to a battery, sets up multiple test points of the battery when the battery is charging or discharging, acquires a voltage value of the battery at each test point, and converts the voltage value into a digital signal.

The computation control module is electrically connected to the detection module, calculates a ratio of a voltage difference of the voltage values at two of the test points over an original voltage difference of the battery, and uses the ratio to map to a corresponding SOH value from a SOH curve of the battery.

The output module is electrically connected to the computation control module and outputs the SOH value obtained by the computation control module.

The computation control module calculates a SOH curve from a battery test procedure. The detection module controls the battery connected therewith to charge or discharge so as to acquire voltage values of the battery at selected test points. After calculating a voltage difference with the acquired voltage values, the computation control module can obtain a ratio of the voltage difference over an original voltage difference of the battery and uses the ratio to map to a SOH value in a SOH curve of the battery for the output module to output the SOH value. As the computation control module just needs to calculate a ratio corresponding to the selected test points and map the ratio to a SOH value in the SOH curve of the battery, the present invention can rapidly detect the SOH and determine an effective capacity of batteries and an age of batteries, thereby solving the existing problems of failing to quickly determining the SOH of batteries and causing incorrect determination of battery capacity and additional maintenance cost.

Other objectives, advantages and novel features of the invention will become more apparent from the following detailed description when taken in conjunction with the accompanying drawings.

DETAILED DESCRIPTION OF THE INVENTION

Figure 1:
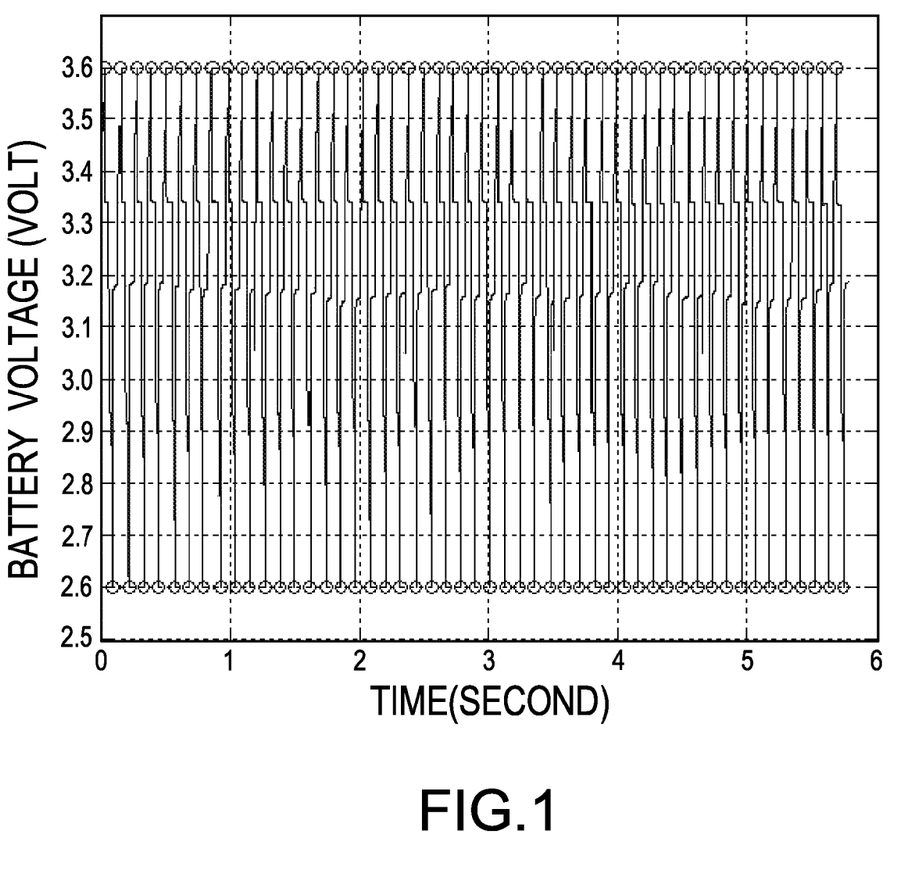
FIG. 1 is a curve graph illustrating charge and discharge tests of a battery used in a first embodiment of a method for detecting SOH of batteries in accordance with the present invention.

With reference to FIG. 1, a first embodiment of a method for detecting SOH of batteries in accordance with the present invention first performs multiple and complete charging/discharging tests (life cycle tests) to a battery to estimate a battery capacity of the battery and a family of charge-discharge characteristic curves is shown. In the present embodiment, the battery is a lithium iron phosphate battery. Voltages of the life cycle test range from 2.6V to 3.6V. A constant charge/discharge rate (C-rate) is applied to perform continuous and repeated life cycle tests, and a relationship between battery capacity and number of charging tests or discharging tests is shown in FIG. 2.

Figure 2:
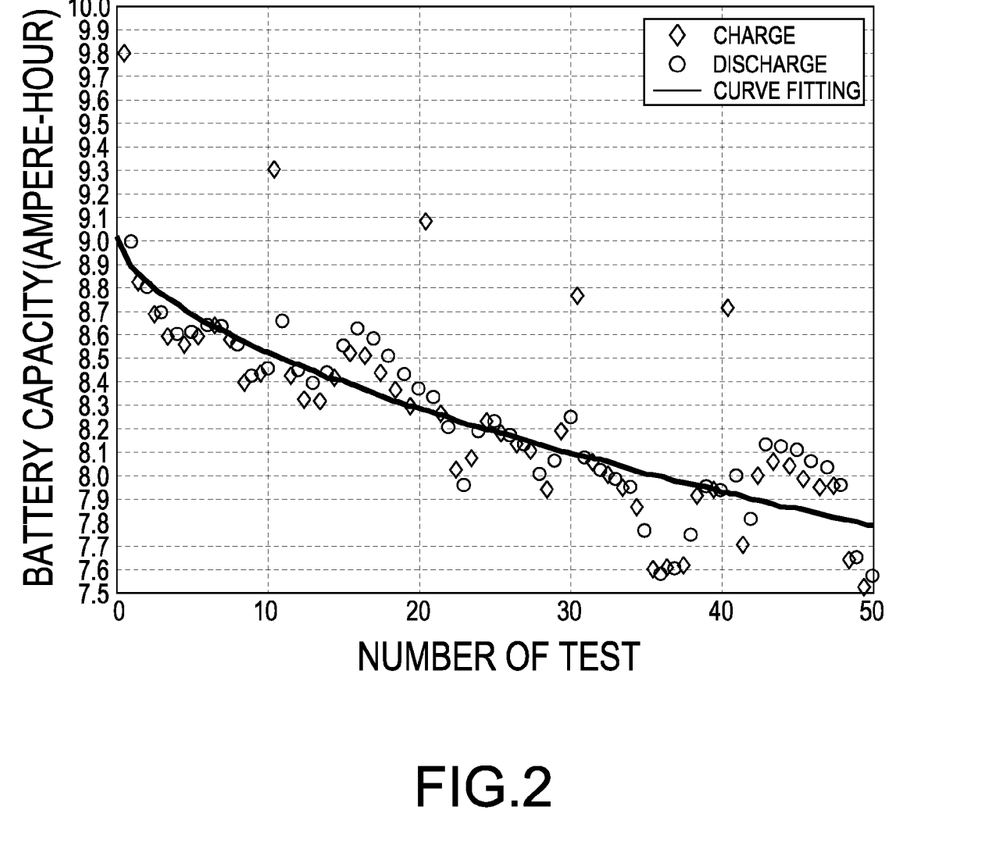
FIG. 2 is a curve graph illustrating an estimated battery capacity of a battery used in a first embodiment of a method for detecting SOH of batteries in accordance with the present invention.

With reference to FIG. 2, an original battery capacity is about 9 Ah. After continuous and repeated life cycle tests for 50 times, the battery capacity drops to about 7.8 Ah, which is approximately 87% of the original battery capacity. Hence, after multiple and complete charging/discharging tests, the battery capacity is degraded by 13%. A curve in relation to the degraded battery capacity with respect to a count of operation can be easily estimated by the foregoing tests (curve fitting).

Figure 3:
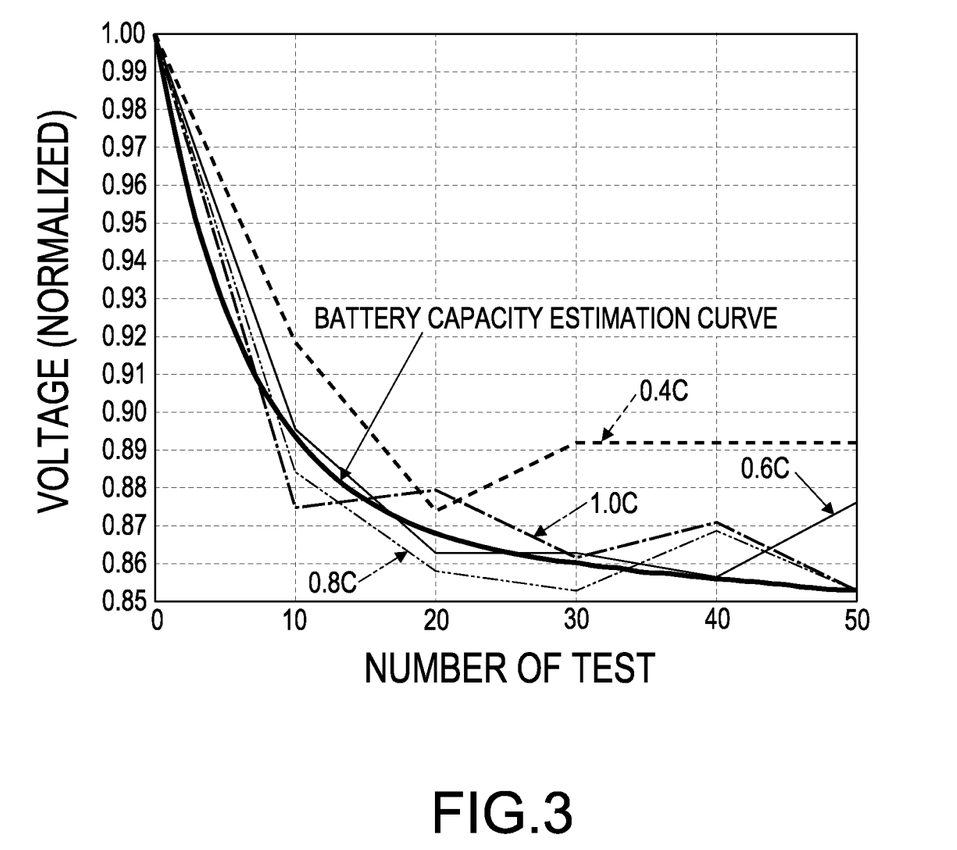
FIG. 3 is a graph illustrating a relationship between curves of normalized voltage difference ratios and continuous cycle tests of a battery used in a first embodiment of a method for detecting SOH of batteries in accordance with the present invention.

During the charge/discharge course of a battery, a voltage detection procedure is introduced to establish a relationship between normalized voltage-difference ratios and numbers of continuous life cycle tests, and a corresponding estimated curve associated with a battery capacity of the battery is shown in FIG. 3. After the normalized voltage difference ratios are applied to test according to different C-rates (0.4C, 0.6C, 0.8C and 1.0C), the obtained curves corresponding to the different C-rates are compared. Despite slight difference in magnitude, all the curves have a similar degradation tendency.

Figure 4:
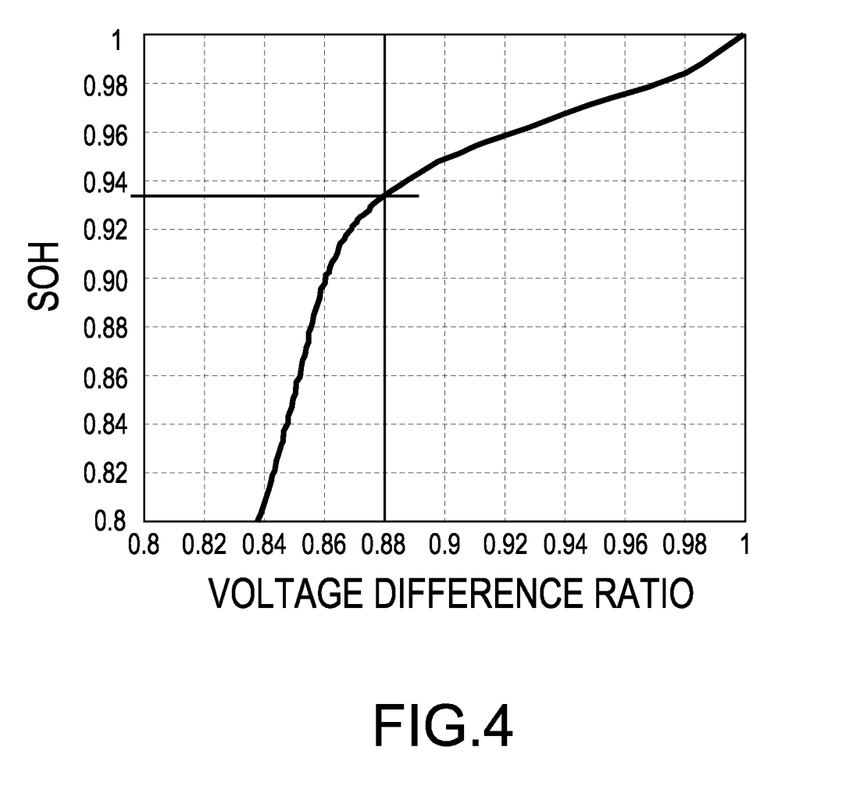
FIG. 4 is a curve graph illustrating SOH of a battery used in a first embodiment of a method for calculating SOH of batteries in accordance with the present invention.

With reference to FIG. 4, after combining and calculating data of the foregoing charging/discharging tests, a state-of-health (SOH) curve of one type of batteries can be obtained. The SOH curve can be taken as a basis for detecting and determining the SOH of such type of batteries. As different types of batteries are made by different materials, the SOH curves thereof may be somewhat different.

Figure 5:
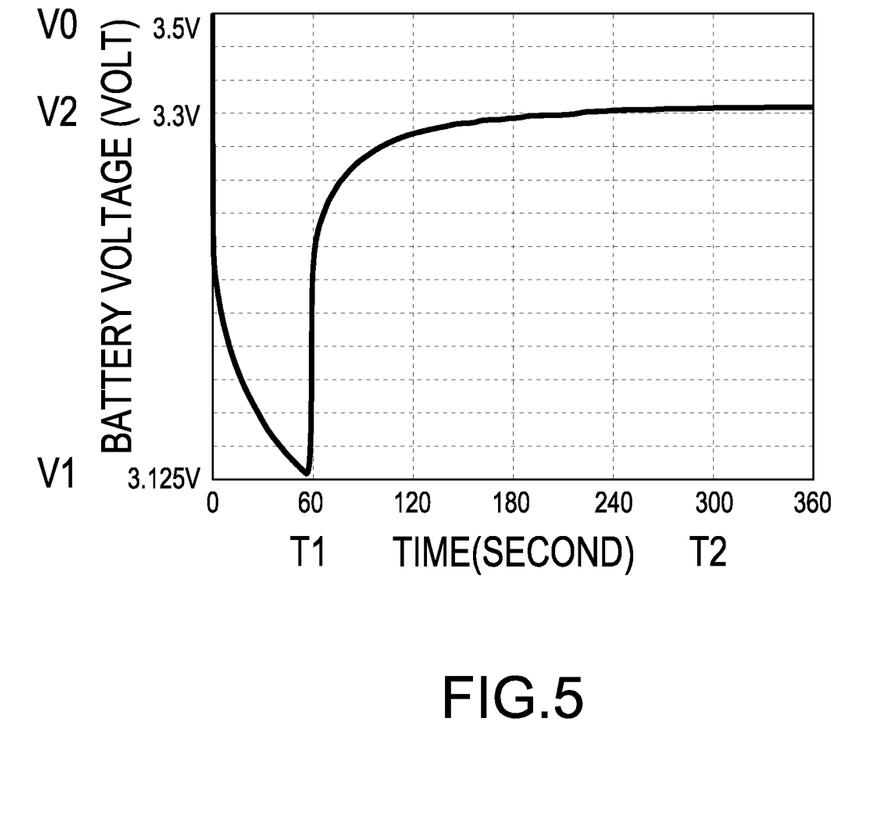
FIG. 5 is a curve graph illustrating a discharging process of a battery used in a first embodiment of a method for detecting SOH of batteries in accordance with the present invention.

With reference to FIG. 5, a first embodiment of a method for detecting SOH of batteries in accordance with the present invention pertains to one test method for detecting SOH of batteries. The test method obtains a discharge curve of a battery by controlling discharge current and discharge time of the battery. When the battery is discharging and a preset discharge time $T_1$ is reached, the battery stops discharging and a voltage value $V_1$ of the battery at a test point when the battery stops discharging is obtained. After a period of time $T_2$, a voltage value $V_2$ at a test point when the voltage value of the battery reaches a stable voltage is obtained. A ratio VR (voltage-difference ratio) of a difference between the voltage value $V_2$ at the test point when the voltage value of the battery reaches a stable voltage and the voltage value $V_1$ at the test point when the battery stops discharging over an original voltage difference $\Delta V_{origin}$ can be obtained, where the original voltage difference is obtained when the battery is not degraded and the aforementioned test is performed. The ratio VR is expressed by the following equation.

$$VR = \frac{V_2 - V_1}{\Delta V_{origin}}$$

The ratio VR can be used to map to a SOH value of the battery in the SOH curve of the battery created by the foregoing test method. For example, suppose that the original voltage difference $\Delta V_{origin}$ is 0.199V, the time when the battery stops discharging is $T_1$, the voltage value of the battery when the battery stops discharging is 3.125V, the time when the battery returns to a stable state is $T_2$, and the voltage value when the voltage value of the battery returns to a stable state is 3.3V. The ratio VR can be calculated as follows.

$$VR = \frac{V_2 - V_1}{\Delta V_{origin}} = \frac{3.3 - 3.125}{0.199} \cong 0.88$$

The ratio VR can be approximately mapped to a SOH value 93.2% from the SOH curve of the battery as shown in FIG. 4. It means that if an originally available capacity of a battery is 10 Ah, the currently available capacity after the foregoing test is performed is 9.32 Ah. Thus, after a battery discharges for a short period of time, the ratio VR can be calculated and the SOH of the battery can be rapidly obtained.

Alternatively, instead of the test point of the battery when the battery stops discharging, a test point at a voltage value V0 of the battery when the battery starts discharging can be chosen for calculating the ratio VR. The ratio VR of a difference between the voltage value V2 at the test point when the voltage value of the battery reaches a stable voltage and the voltage value V0 at the test point when the battery starts discharging over the original voltage difference $\Delta$Vorigin can be obtained.

Figure 6:
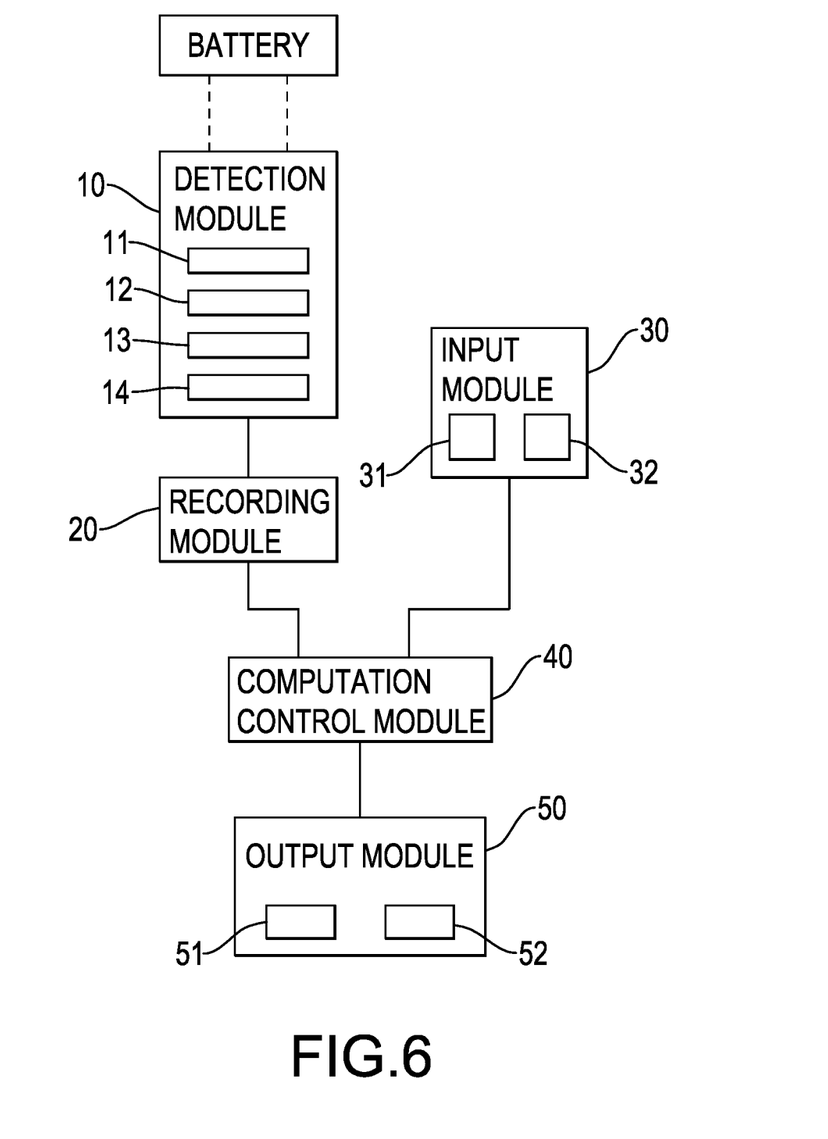
FIG. 6 is a functional block diagram of a device for detecting SOH of batteries for performing a first embodiment of a method for detecting SOH of batteries in accordance with the present invention.

With reference to FIG. 6, a device for detecting SOH of batteries in accordance with the present invention has a detection module 10, a recording module 20, an input module 30, a computation control module 40 and an output module 50.

The detection module 10 has a measuring unit 11, a charge/discharge control unit 12, a filtering control unit 13 and a data-measuring unit 14. The charge/discharge control unit 12 is electrically connected to the measuring unit 11 and the filtering control unit 13. The data-measuring unit 14 is electrically connected to the filtering control unit 13. The measuring unit 11 is connected to a battery to be tested. The charge/discharge control unit 12 serves to control a discharge current and a discharge time of the battery and is configured with multiple test points so as to obtain the voltage values of the battery at the test points. The voltage values of the battery at those test points respectively correspond to the voltage value when the battery stops discharging $V_1$ and the voltage value when the battery returns to a stable state $V_2$. The filtering control unit 13 performs a filtering processing. The data-measuring unit 14 further converts the analog signals of the filtered voltage values or current values into digital signals.

The recording unit 20 is connected to the detection unit 10, and serves to record the digital signals or data transmitted from the data-measuring unit 14 and record data of the input module 30 or the computation control module 40.

The input module serves to receive a type or a model number of the battery to be tested that is externally inputted and a SOH curve corresponding to the type or model number of the battery. In the present embodiment, the input module 30 has a scanning unit 31 or a data input unit 32, acquires the type or model number of the battery to be tested by scanning, sensing or inputting data, and further stores the externally inputted SOH curve through the computation control module 40 so that users can directly access an internal SOH curve corresponding to the battery to be tested.

The computation control module 40 is connected with the recording module 20 and the input module 30, serves to perform computation according to the digital signals stored in the recording module 20, receives a digital signal of the voltage value of the battery to be tested at each test point from the charge/discharge control unit 12, calculates to obtain the ratio VR to be stored by the recording module 20 or to be mapped to a SOH value of the battery from the SOH curve inputted by the input module 30, thereby directly and rapidly determining the SOH of the battery to be tested.

The output module 50 is connected with the computation control module 40, serves to output or display a SOH value computed by the computation control module 40, and has a data transmission unit 51 and a display unit 52. The SOH value computed by the computation control module 40 can be further transmitted to an external display or recording device through the data transmission unit 51 in a wireless or wired pattern. The SOH value computed by the computation control module 40 can be transmitted to the display unit 52 directly or through the data transmission unit 51 to an external device for data display or data integration.

Figure 7:
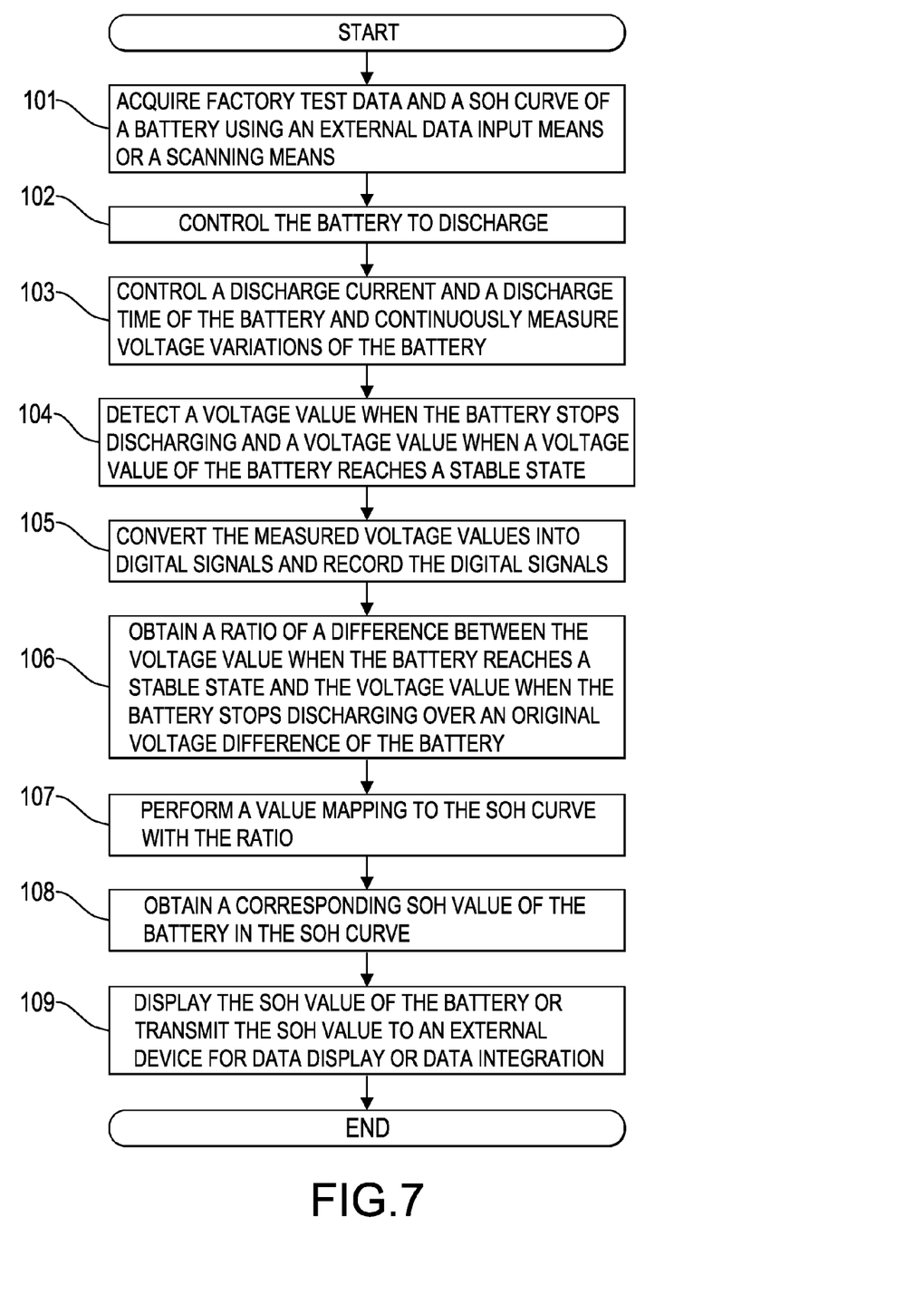
FIG. 7 is a flow diagram of a first embodiment of a method for detecting SOH of batteries in accordance with the present invention.

With reference to FIG. 7, a first embodiment of a method for detecting SOH of batteries in accordance with the present invention has the following steps:

Step 101: Acquire original test data and a SOH curve of a battery using an external data input means or a scanning means. The input module 30 acquires original test data of a battery by an external data input means or a scanning means. The original test data include a battery capacity estimation curve determined by values of voltage, current and battery capacity obtained from multiple life cycle tests of the battery. The battery capacity estimation curve can be converted into a SOH curve of the battery.

Step 102: Control the battery to discharge. The battery is connected to the detection module 10 for the detection module 10 to perform discharge control over the battery.

Step 103: Control a discharge current and a discharge time of the battery and continuously measure voltage variations of the battery. The detection module controls the discharge current and the discharge time of the battery and continuously measures the voltage variations of the battery.

Step 104: Detect a voltage value when the battery stops discharging and a voltage value when a voltage value of the battery reaches a stable state. When detecting that a preset discharge time expires, the detection module 10 stops discharging and obtains the voltage value of the battery when the battery stops discharging and the voltage value of the battery when the voltage value reaches a stable state.

Step 105: Convert the measured voltage values into digital signals and record the digital signals. The detection module 10 converts the measured voltage values of the battery into digital signals through an analog/digital conversion.

Step 106: Obtain a ratio of a difference between the voltage value when the battery reaches a stable state and the voltage value when the battery stops discharging over an original voltage difference of the battery. The computation control module 40 first subtracts the voltage value when the battery stops discharging from the voltage value when the battery reaches the stable state and then obtains the ratio of the difference over the original voltage difference of the battery.

Step 107: Perform a value mapping to the SOH curve with the ratio.

Step 108: Obtain a corresponding SOH value of the battery in the SOH curve.

Step 109: Display the SOH value of the battery or transmit the SOH value to an external device for data display or data integration. The output module 50 displays the SOH value of the battery or transmits the SOH value to an external device for data display or data integration.

Figure 8:
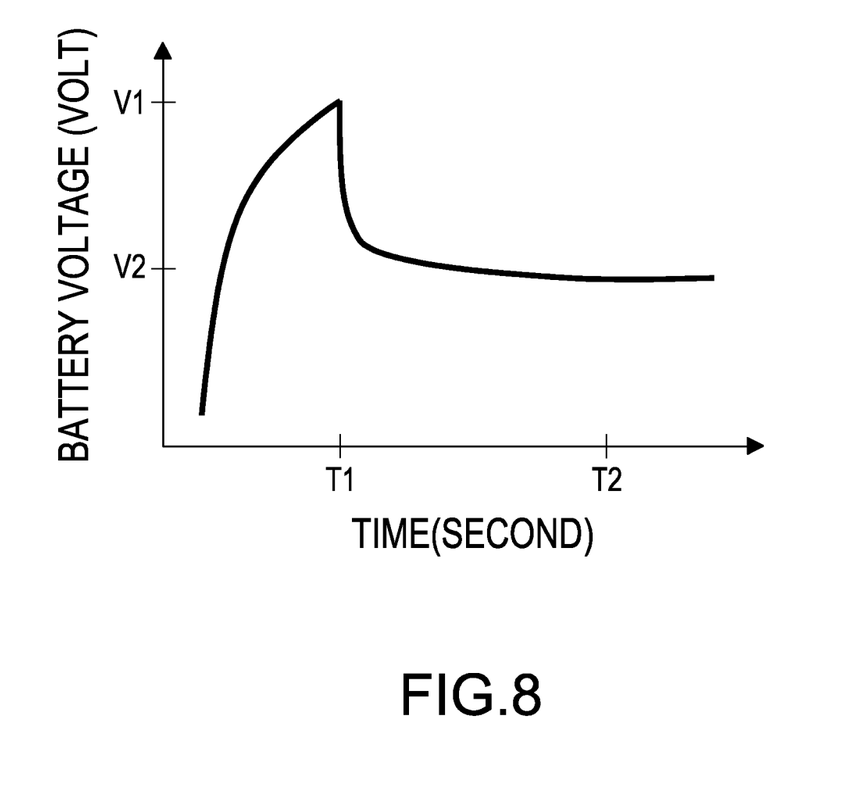
FIG. 8 is a curve graph illustrating a charging process of a battery used in a second embodiment of a method for detecting SOH of batteries in accordance with the present invention.

With reference to FIG. 8, a second embodiment of a method for detecting SOH of batteries in accordance with the present invention is basically the same as the first embodiment except that the voltage detection procedure is a charging test. A test point when a battery stops charging and a test point when the voltage of the battery drops to a stable state are set up, and a voltage value $V_1$ at the test point when the battery stops charging and a voltage value $V_2$ at the test point when the voltage of the battery drops to a stable state are detected. A voltage difference is obtained by subtracting $V_1$ from $V_2$. A ratio of the voltage difference over an original voltage difference of the battery is obtained and the ratio can be mapped to a corresponding SOH value from a SOH curve of the battery obtained from the charging test to indicate a health degree of the battery.

Figure 9:
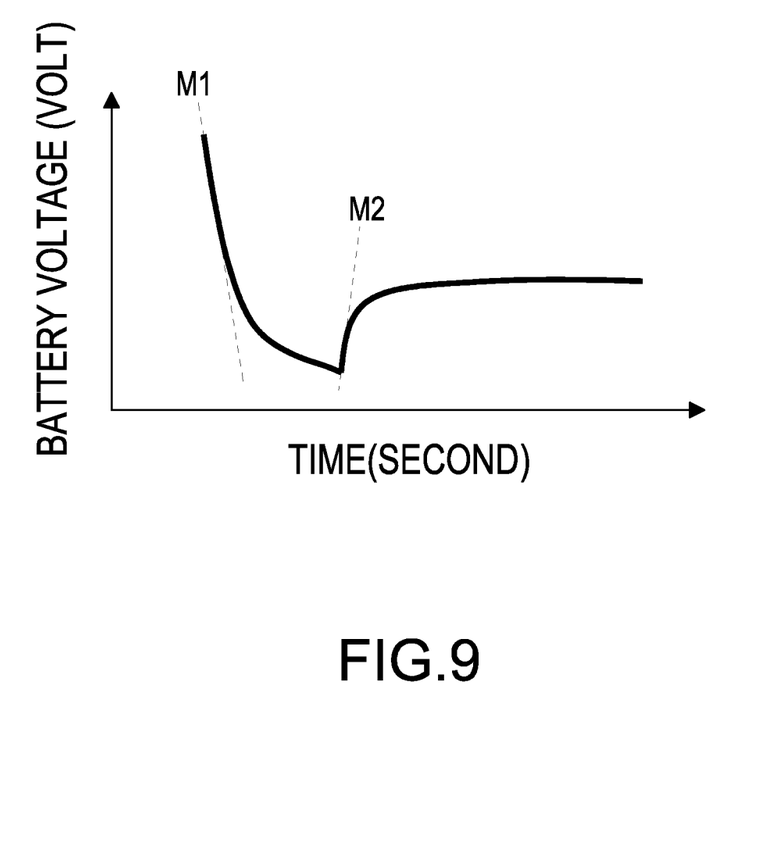
FIG. 9 is a curve graph illustrating initial slopes of a discharging process of a battery used in a third embodiment of a method for detecting SOH of batteries in accordance with the present invention.
Figure 10:
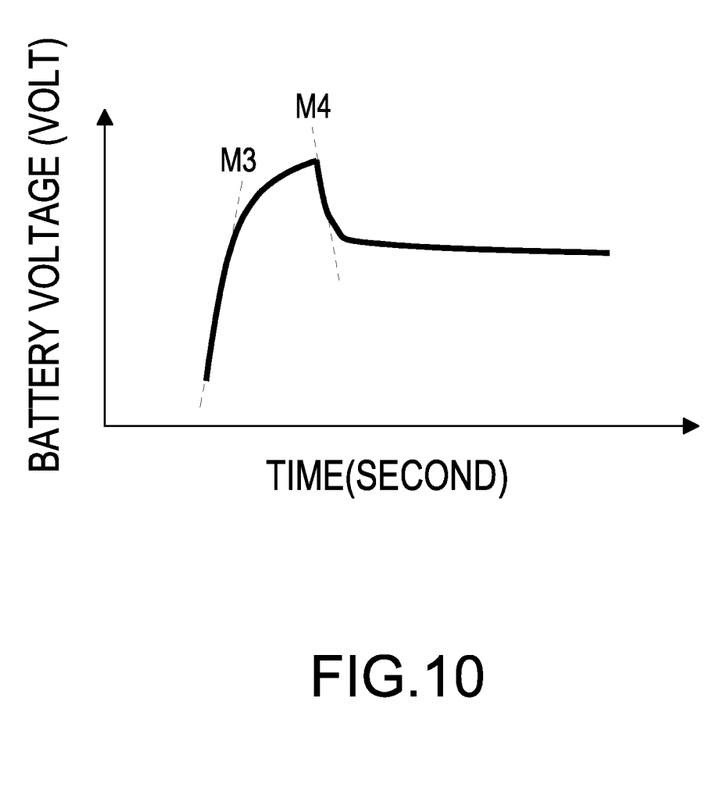
FIG. 10 is a curve graph illustrating initial slopes of a charging process of a battery used in a third embodiment of a method for detecting SOH of batteries in accordance with the present invention.

With reference to FIGS. 9 and 10, a third embodiment of a method for detecting SOH of batteries in accordance with the present invention is basically the same as the first and second embodiments except that the voltage detection procedure obtains slopes (M1, M2, M3 or M4) at initial test points of a charging curve or a discharging curve when the battery is charging or discharging, and the slopes are calculated by the computation control module 40 and are mapped to a corresponding SOH value of the battery from a SOH curve of the battery defined by the slopes obtained during the charging test or the discharging test.

In sum, to determine SOH of a battery, the battery does not have to be fully charged and then completely discharging, which usually takes a long time. The ratio of a voltage difference measured when the battery is charging or discharging for a short period of time over an original voltage difference of the battery or the slopes of particular test points measured when the battery is charging or discharging for a short period of time can be used to map to a SOH value in a SOH curve of the battery as a basis of determining if the battery to be tested is degraded. Accordingly, the present invention solves the slow determination of SOH, incorrect determination of battery capacity, and maintenance cost waste for a battery.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A method for detecting state of health of batteries performed by a device for detecting state of health of batteries having a detection module, an input module and a computation control module, the method comprising steps of:

providing a state-of-health (SOH) curve for a battery through the input module of the device;

performing a voltage detection procedure for detecting and recording voltage values of the battery at multiple test points set up in the voltage detection procedure through the detection module of the device, wherein when the voltage detection procedure is a discharging test, the test points respectively correspond to one test point when the battery either stops or starts discharging and another test point when the battery reaches a stable state, and the voltage values of the test points respectively correspond to those when the battery either stops or starts discharging and when the battery reaches the stable state; and when the voltage detection procedure is a charging test, the test points respectively correspond to one test point when the battery either stops or starts charging and another test point when the battery reaches a stable state, and the voltage values of the test points respectively correspond to those when the battery either stops or starts charging and when the battery reaches the stable state; and calculating a ratio of a voltage difference between the voltage values at two of the test points over an original voltage difference and using the ratio to map to a SOH value in the SOH curve through the computation control module of the device;

wherein when the voltage detection procedure is a discharging test, the ratio is equal to a voltage difference between the voltage values of the battery at the test points when the battery stops or starts discharging and when the battery reaches the stable state over the original voltage difference of the battery; and when the voltage detection procedure is a charging test, the ratio is equal to a voltage difference between the voltage values of the battery at the test points when the battery stops or starts charging and when the battery reaches the stable state over the original voltage difference of the battery.

2. The method as claimed in claim 1, wherein when the voltage detection procedure is a charging test, multiple slopes are obtained at multiple initial test points on a charging curve of the battery and are used to map to a corresponding SOH value of the battery from the SOH curve defined by the slopes.

3. The method as claimed in claim 1, wherein when the voltage detection procedure is a discharging test, multiple slopes are obtained at multiple initial test points on a discharging curve of the battery and are used to map to a corresponding SOH value of the battery from the SOH curve defined by the slopes.

4. A device for detecting state of health (SOH) of batteries, comprising:

a detection module having:

a measuring unit adapted to connect to a battery;

a charge and discharge control unit serving to control a discharge current and a discharge time of the battery measured by the measuring unit, configure multiple test points of the battery, and obtain voltage values at the test points, wherein the voltage values at the test points respectively correspond to a voltage value when the battery stops discharging and a voltage value when the battery reaches a stable state;

a filtering control unit electrically connected to the charge and discharge control unit and filtering voltage of the battery at the test points; and a data-measuring unit electrically connected to the filtering control unit and converting the filtered voltage into digital signals;

a computation control module receiving the digital signal of the voltage at each test point from the charge and discharge control unit, calculating a ratio of a voltage difference of the voltage values at two of the test points over an original voltage difference of the battery, and using the ratio to map to a corresponding SOH value from a SOH curve of the battery; and an output module electrically connected to the computation control module and outputting the corresponding SOH value obtained by the computation control module.

5. The device as claimed in claim 4, further comprising a recording module and an input module, wherein the computation control module is connected to the recording module and the input module, the recording module serves to record the digital signals transmitted from the the data-measuring unit and data of the input module or the computation control module, and the input module serves to input a type or a model number of the battery and the SOH curve corresponding to the battery.

6. The device as claimed in claim 5, wherein the input module has a scanning unit or a data input unit.

* * * * *